United States Patent [19]
Roy

[11] Patent Number: 5,132,244
[45] Date of Patent: Jul. 21, 1992

[54] GROWTH-MODIFIED THERMAL OXIDATION FOR THIN OXIDES

[75] Inventor: Pradip K. Roy, Allentown, Pa.

[73] Assignee: AT&T Bell Laboratories, Murray Hill, N.J.

[21] Appl. No.: 714,360

[22] Filed: Jun. 12, 1991

Related U.S. Application Data

[63] Continuation of Ser. No. 287,976, Dec. 21, 1988, abandoned.

[51] Int. Cl.$^5$ .................. H01L 21/322; H01L 21/324
[52] U.S. Cl. ..................................... 437/13; 437/239; 437/946; 148/DIG. 118
[58] Field of Search ................... 437/10, 13, 235, 238, 437/239, 937, 946, 244, 243; 148/DIG. 118

[56] References Cited

U.S. PATENT DOCUMENTS

| | | | |
|---|---|---|---|
| 3,447,238 | 6/1969 | Heynes et al. | 437/238 |
| 3,698,948 | 10/1972 | Barone et al. | 437/238 |
| 3,770,498 | 11/1973 | Flowers | 437/238 |
| 3,800,411 | 4/1974 | Abbink et al. | 437/238 |
| 3,997,368 | 12/1976 | Petroff et al. | 437/247 |
| 4,007,297 | 2/1977 | Robinson et al. | 437/238 |
| 4,048,350 | 9/1977 | Glang et al. | 437/238 |
| 4,116,719 | 9/1978 | Schimizu et al. | 437/238 |
| 4,139,402 | 2/1979 | Steinmaier et al. | 437/238 |
| 4,140,548 | 2/1979 | Zimmer | 148/1.5 |
| 4,149,905 | 4/1979 | Levinstein et al. | 437/13 |
| 4,159,917 | 7/1979 | Gluck | 437/13 |
| 4,231,809 | 11/1980 | Schmidt | 437/238 |
| 4,518,630 | 5/1985 | Grasser | 437/238 |
| 4,548,654 | 10/1985 | Tobin | 437/10 |
| 4,622,082 | 11/1986 | Dyson et al. | 437/10 |
| 4,687,682 | 8/1987 | Koze | 437/238 |
| 4,806,202 | 2/1989 | Tang et al. | 437/238 |
| 4,851,358 | 7/1989 | Huber | 437/10 |
| 4,851,370 | 7/1989 | Doklan et al. | 437/238 |
| 4,894,353 | 1/1990 | Ibok | 437/238 |
| 4,906,595 | 3/1990 | van der Plas et al. | 437/238 |
| 4,914,059 | 4/1990 | Nissim et al. | 437/238 |
| 4,920,076 | 4/1990 | Holland et al. | 437/238 |

OTHER PUBLICATIONS

Wolf et al., Silicon Processing for the VLSI Era, Lattice Press, 1986, pp. 61-70.
"Cleaning Solutions Based on Hydrogen Peroxide...", W. Kern, RCA Review, vol. 31, Jun. 1970, pp. 187-206.
"The Use of 1.1.1-Trichloroethane...", E. J. Janssens et al., J. Electrochem. Soc., vol. 125, No. 10, Oct. 1978, pp. 1696-1703.
"A Method of Forming Thin and Highly Reliable Gate Oxides", C. Hashimoto et al., J. Electrochem. Soc., vol. 127, No. 1, Jan. 1980, pp. 129-135.
"A 100 Å Thick Stacked...", T. Watanabe et al., Proceedings, International Reliability Phys. Symp., 1985, pp. 18-23.
"Rapid Thermal Processing of Thin Gate Dielectrics...," J. Nulman et al., IEEE Electron Device Lett., vol. EDL-6, No. 5, May 1985, pp. 205-207.
"Effects of Preoxidation Ambient...," J. Ruzyllo, J. Electrochem Soc., vol. 133, No. 8, Aug. 1986, pp. 1677-1682.

Primary Examiner—Mary Wilczewski
Attorney, Agent, or Firm—Wendy W. Koba

[57] ABSTRACT

A method is disclosed for growing relatively thin (e.g., <250 Å) thermal oxides which results in lowering the defect density, mobile ion concentration, interface trapped charge density, and stress of the structure. In particular, the prior art oxidation process is modified to include in situ preoxidation silicon surface treatments to improve the silicon nucleation surface. For example, gettering operations may be performed to remove metal-ion contaminants from the silicon nucleation surface, and high temperature annealing operations may be performed to remove any local stress gradients which exist in the silicon substrate during the initial stages of oxidation. By improving the silicon nucleation surface, the subsequently grown thin oxide will be improved in terms of the qualities mentioned above.

4 Claims, 7 Drawing Sheets

GROWTH-MODIFIED THERMAL OXIDATION FOR THIN OXIDES

This application is a continuation of application Ser. No. 07/287,976, filed on Dec. 21, 1988, now abandoned.

BACKGROUND OF THE INVENTION

1. Technical Field

The present invention relates to a growth-modified thermal oxidation process for forming thin (e.g., <250 Å) oxides for use in silicon integrated circuits.

2. Description of the Prior Art

A major impediment to providing ultra-large scale (>10 million devices/chip) silicon-based integrated circuits, based on sub-micron design rules, has been the inability to grow extremely thin oxides which exhibit the necessary low defect density ($D_o$), low charge trapping density ($Q_{it}$), and atomically sharp, stress-free $Si/SiO_2$ interface. It has been determined that the characteristics of the silicon nucleation surface play a significant part in determining the characteristics of the grown oxide. Preoxidation cleaning of the silicon surface, as described in detail in an article entitled "Cleaning Solutions Based on Hydrogen Peroxide for use in Silicon Semiconductor Technology", by W. Kern et al. appearing in *RCA Review*, Vol. 31, June 1970, pp. 187-206, has been found to improve the nucleation surface. In particular, the Kern et al. article discusses the use of various solutions, including $H_2O_2$-$NH_4OH$ and $H_2$-$H_2O_2$-$HCl$ to prepare a silicon surface for oxidation. This preoxidation cleaning has become an integral part of oxidation technology. Such cleaning processes, however, cannot alleviate the problems of growth-induced oxide defects and interfacial stress between the silicon substrate and the grown oxide.

In an alternative method of improving the oxide quality, a small amount of a chlorine-bearing vapor may be added to the oxidant during growth. This particular work is described in detail in the reference entitled "The Use of 1.1.1-Trichloroethane as an Optimized Additive to Improve the Silicon Thermal Oxidation Technology", by E. J. Janssens et al. appearing in the *Journal Electrochem. Society*, Vol. 125, No. 10, October 1978, pp. 1696-1703. The addition of the chlorine-bearing species (for example, hydrochloric acid (HCl), trichloroethane (TCA), trichloroethene (TCE) has been found to reduce the concentration of mobile ions, oxide defects, and surface charge density in the oxide. However, such oxides still exhibit growth-induced defects, alkali metal contamination and interfacial stress problems.

A stacked film of $SiO_2/Si_3N_4/SiO_2$ with a total thickness of between 100-200 Å has been demonstrated to obtain a relatively low defect density ($D_o=0.5$ cm$^{-2}$). See, for example, the article entitled "A 100 Å Thick Stacked $SiO_2/Si_3N_4/SiO_2$ Dielectric Layer for Memory Capacitor" by T. Watanabe et al. appearing in the *Proceedings of the International Reliability Physics Symposium*, 1985, pp. 18-23. However, the $Si_3N_4/SiO_2$ interface is known to exhibit a high density of interface charge trapping states, $Q_{it}$, which cannot be removed by annealing since the nitride is impervious to the oxidizing species. This tri-level structure is unsuitable as a gate dielectric in MOS integrated circuits, as these interface states may cause charge-induced shifts in threshold voltage, as well as a reduction in channel conductance during device operation.

Thus, a need remains in the prior art for a method of forming a thin oxide which exhibits the characteristics required for use as a gate dielectric in sub-micron MOS device structures.

SUMMARY OF THE INVENTION

The problem remaining in the prior art is addressed by the present invention which relates to a growth-modified thermal oxidation process for forming thin (e.g., <250 Å) oxides and, more particularly, to a process including in situ preoxidation silicon surface treatments which result in minimizing growth abnormalities in the growing oxide layer, thus improving the quality of the oxide structure and the substrate/oxide interface.

In accordance with the present invention, any suitable in situ treatment may be utilized which will getter defects on the silicon surface, provide stress relief to the thermally grown oxide, or both. Particular examples of such processes include an in situ Cl$^-$ (for example, HCl, TCA or TCE) getter (at a temperature within the range of 600°-750° C., for example) and a high-temperature (~900°-950° C.) stress-relief anneal, respectively. As will be described in detail hereinafter, these gettering and annealing processes may be used either alone or in combination, with the best results associated with the combined procedures.

The various types and combinations of suitable preoxidation silicon surface treatments will be described in detail hereinafter, in association with the following drawings.

BRIEF DESCRIPTION OF THE DRAWING

Referring now to the drawings which are illustrative of the inventive process.

DETAILED DESCRIPTION

The growth-modified oxidation process of the present invention, as will be described in detail below, relates to the formation of a thermally grown oxide layer. Thermal oxidation of silicon occurs by Fickian diffusion of the oxidant through the grown oxide and the reaction of the oxidant with the silicon at the Si/SiO$_2$ interface by a first-order chemical process. The process results in an inward propagation of this interface and generates the best possible passivation for the silicon layer. Other types of processes, for example, chemical vapor deposition (CVD), results in relatively inferior passivation where the deposited oxide layer exhibits a relatively poor quality dielectric for gate oxide applications in ultra-large scale integration (ULSI) of semiconductor integrated circuits.

Figure 1:
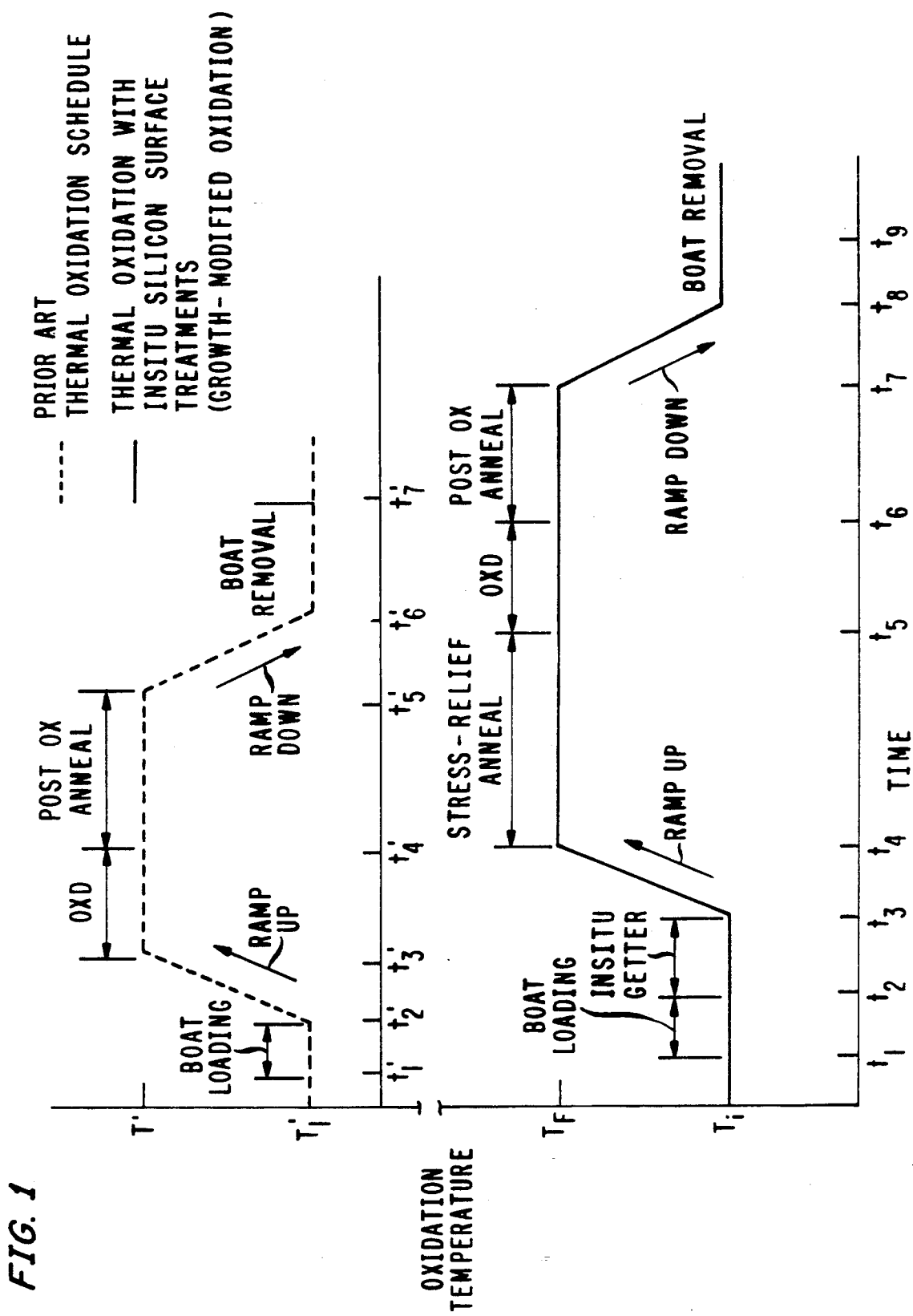
FIG. 1 illustrates an exemplary thermal oxidation process sequence including preoxidation silicon surface treatments in accordance with the present invention, with a prior art thermal oxidation process being illustrated for comparison.

Reference is made to FIG. 1 which outlines the processing sequence for both a prior art thermal oxidation process and an exemplary growth-modified process of this invention. For the prior art process, the silicon wafer is transferred into the furnace during the time period $t'_1-t'_2$ (10 minutes, typical). The furnace temperature during this initial period, $T_i'$, is approximately 750° C. During the subsequent time period $t'_2-t'_3$, the temperature of the furnace is ramped up to its final value, $T_f'$, of approximately 900° C. A typical ramping of 5° C./min may be used, requiring approximately 40 minutes to bring the furnace to temperature $T_f'$. The wafers are then exposed to an oxygen ambient to begin the formation of the oxide layer. A chlorine-bearing species (see Janssens et al. supra.,) may be included with this oxygen ambient to further improve the quality of the growing oxide layer. The oxygen exposure proceeds for the time period $t'_3-t'_4$, where the length of this period depends on the desired thickness of the oxide layer. For example, a 20-30 minute exposure will grow an oxide approximately 250 Å thick.

A post-oxidation anneal from $t_4'$ to $t_5'$ is then performed to eliminate any trapped charges from the grown oxide film. The temperature of the furnace is then slowly ramped down to its initial value of $T_i'$ during time period $t_5'-t_6'$. The wafer is then slowly removed from the furnace during time period $t_5'-t_7'$.

An oxide layer comprising a thickness of approximately 250 Å, as grown by this prior art process, yields a defect density $D_o$ of approximately 0.35/cm$^2$, a mobile ion concentration $N_{mi}$ of $1.5 \times 10^{10}$/cm$^2$, an interface trapped charge density $Q_{it}$ of $5.0 \times 10^{10}$/cm$^2$, and a silicon substrate stress of $1.58 \times 10^9$ dynes/cm$^2$. A thinner oxide of approximately 150 Å yielded the following characteristics: $D_o=0.74$/cm$^2$, $N_{mi}=4.05 \times 10^{10}$/cm$^2$, $Q_{it}=9.0 \times 10^{10}$/cm$^2$, and silicon stress of $2.72 \times 10^9$ dynes/cm$^2$. The stress results for the 250 Å layer are illustrated in graph form in FIG. 2 and will be discussed in detail hereinafter with respect to FIG. 2.

As discussed in detail above, these measured characteristics of the prior art thermally grown thin oxides are unacceptable when such oxides are used as gate dielectrics for sub-micron sized devices (ULSI applications), or in other situations (charge-coupled devices, for example) where defect density, mobile ion concentration, interface trapped charge density, or silicon stress conditions near the interface are important considerations.

The growth-modified oxidation process of the present invention has been found to improve these and other characteristics of a thermally grown thin oxide. One exemplary process sequence is illustrated in FIG. 1, where it may be easily compared against the prior art process described above. The process begins with the transport of the wafer into the furnace during $t_1-t_2$ (10 minutes), similar to the prior art process. The initial temperature, $T_i$, of the furnace at this point is approximately 750° C. Following this loading period, a first surface treatment occurs, a gettering of the silicon surface in a dilute chlorine containing ambient (for example, HCl or TCA or TCE). The gettering during time period $t_2-t_3$ (thirty minutes, for example) is utilized to remove any metal-ion contaminants which may exist on the silicon nucleation surface. By performing this gettering operation, the concentration of mobile ions, $N_{mi}$, will be significantly reduced in the grown oxide, when compared with prior art structures. Following this operation, the temperature of the furnace is ramped up during time period $t_3-t_4$ to the $T_f$ of 900° C. (the same 5° C./min ramp procedure may be used).

A second surface treatment, a stress-relief anneal, is introduced at this point during time period $t_4-t_5$. An anneal in an inert atmosphere (100% Ar, for example) is performed (approximately thirty minutes) to minimize the local variations in the stress fields near the silicon surface. The stress at the silicon surface is the result of a small amount of native oxide which begins to form on the nucleation surface even before the actual oxidation step is initiated. The native oxide, being discontinuous will always generate local stress gradients in silicon due to thermal expansion mismatch of Si and SiO$_2$, and also due to the large change in index volume associated with the Si→SiO$_2$ transformation. These locally stressed regions affect the oxidation growth kinetics and the Si/SiO$_2$ interface substructure. The effect of these local stress gradients on the quality of the grown oxide becomes further amplified due to complex processing and device geometries. The argon anneal is thought to relax at least some of these locally stressed zones and thereby reduce some of the growth abnormalities in the grown oxide layer.

Following this anneal, the procedure may be identical to the prior art sequence described above. In particular, the oxidation of the silicon surface occurs during time period $t_5-t_6$ (where again, the length of time is related to the desired thickness of the oxide), followed by an anneal during time period $t_6-t_7$. The temperature of the furnace is then ramped down during time period $t_7-t_8$ and the oxidized wafer removed from the furnace.

An oxide layer comprising a thickness of approximately 250 Å, as grown by this particular process of the present invention, yields a defect density $D_o$ of approximately 0.15/cm$^2$, a mobile ion concentration $N_{mi}$ of less than $0.2 \times 10^{10}$/cm$^2$, an interface trapped charge density $Q_{it}$ of less than $2.5 \times 10^{10}$/cm$^2$, and a silicon substrate stress of $0.4 \times 10^9$ dynes/cm$^2$. A thinner oxide on the order of 150 Å exhibited the following characteristics: $D_o=0.43$/cm$^2$, $N_{mi}=2.0 \times 10^{10}$/cm$^2$, $Q_{it}=5.0 \times 10^{10}$/cm$^2$, and silicon stress of $0.90 \times 10^9$ dynes/cm$^2$. The silicon stress data are illustrated in graph form in FIG. 2. A comparison of these results with those of the prior art thermal oxide illustrates the significant improvement in thin oxide quality when the preoxidation silicon surface treatments of the present invention are utilized.

Table 1, below, summarizes these various properties discussed above for four different oxides: (1) a prior art thermal oxide; (2) a growth-modified oxide grown using both a preoxidation contamination getter and a preoxidation stress-relief anneal; (3) a growth-modified oxide grown using only a preoxidation contamination getter; and (4) a growth-modified oxide grown using only a preoxidation stress-relief anneal. As clearly indicated by these results, a growth-modified process including both a gettering operation and an anneal is the preferred alternative in achieving the best quality thin oxide.

Figure 2:
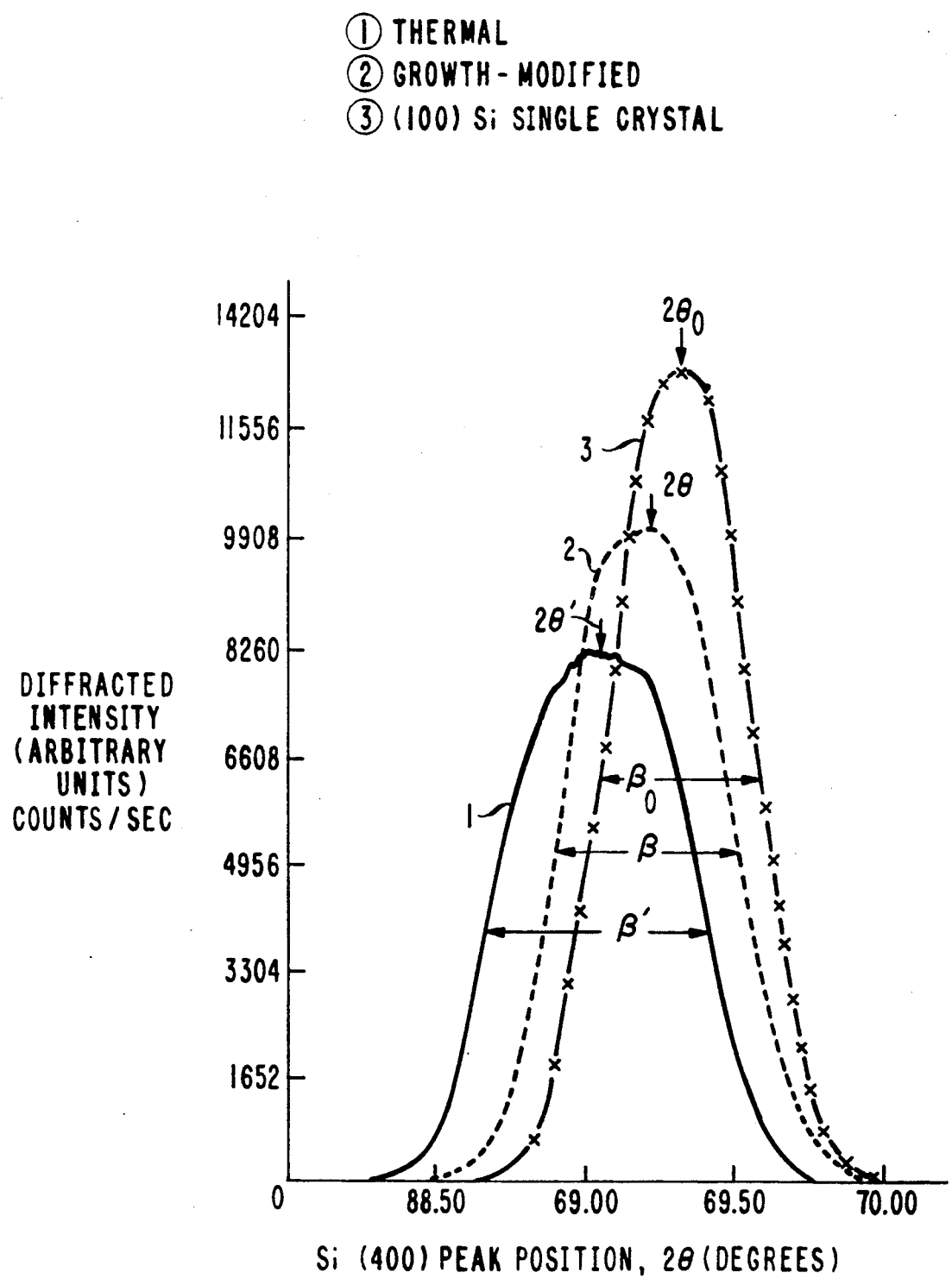
FIG. 2 illustrates the Si(400) X-ray microdiffraction (XRMD) peak profiles in (100) Si/SiO$_2$ structures fabricated using various preoxidation silicon surface treatments.

FIG. 2, referred to above, further illustrates these results. FIG. 2 contains plots of the silicon (400) X-ray microdiffraction (XRMD) peak profiles for the following: (1) a structure containing a prior art thermal oxide; (2) a structure containing a growth-modified oxide; and (3) a nominal silicon substrate without any oxide, the latter being included for comparison purposes only. It is well-known that the stress in a silicon layer near the $Si/SiO_2$ interface also reflects the state of stress within the grown oxide layer, particularly in the case of thin oxide layers. Thus, by measuring the substrate stress, the level of stress within the thermal oxide may be deduced. The silicon (400), $2\theta$ peak position is a direct measure of the interplanar spacing (d) of the (400) plane of the silicon. Any deviation in peak position from the unstressed value of $2\theta_o$ is a measure of lattice dilation ($d - d_o$ or $\Delta_d$) that can be converted to the stress in silicon ($\sigma_{si}$) from the known elastic stiffness values of silicon. Additionally, the peak breadth, denoted $\beta$, of the silicon (400) peak profile provides information about the silicon substructure the silicon near the $Si/SiO_2$ interface.

Referring in particular to FIG. 2, the peak profile for nominal (100) single crystal silicon is seen to be relatively narrow, with a $2\theta_o$ peak position of 69.1975° and a width $\beta_o$ of approximately 0.7000°. In contrast, the peak profile for the structure with a prior art thermal oxide is seen to be much broader, with a $\beta'$ of approximately 0.7300°. As mentioned above, this broadening is related to an increase in the silicon defect density near the interface. Also, the $2\theta'$ peak position is seen to have shifted to a value of 69.1400°, indicating an increase in stress in a structure which includes a prior art thermal oxide.

The peak profile associated with the growth-modified structure of the present invention is seen to provide improvement in both peak position $2\theta$ and peak width $\beta$. As discussed above, a preoxidation silicon surface treatment in the form of an in situ getter has been found to remove metal-ion contaminants from the silicon nucleation surface, thus reducing growth anomalies in the oxide layer and lowering the defect density. Thus, the gettering operation will provide a shift in the $2\theta$ peak position closer towards the nominal value associated with (100) single crystal silicon. In this case, as seen by reference to FIG. 2, a value for $2\theta$ of 69.1820° was achieved. The narrowing of the peak width, $\beta$, as discussed above, is provided by relieving the stress in the silicon substrate near the interface with the oxide. Stress relief is accomplished by a preoxidation silicon surface treatment in the form of a high temperature anneal. As illustrated in FIG. 2, such a process has been found to shrink the peak width $\beta$ to a value of approximately 0.7180°, relatively close to the nominal width of 0.7000°, associated with the (100) single crystal silicon substrate.

Figure 3:
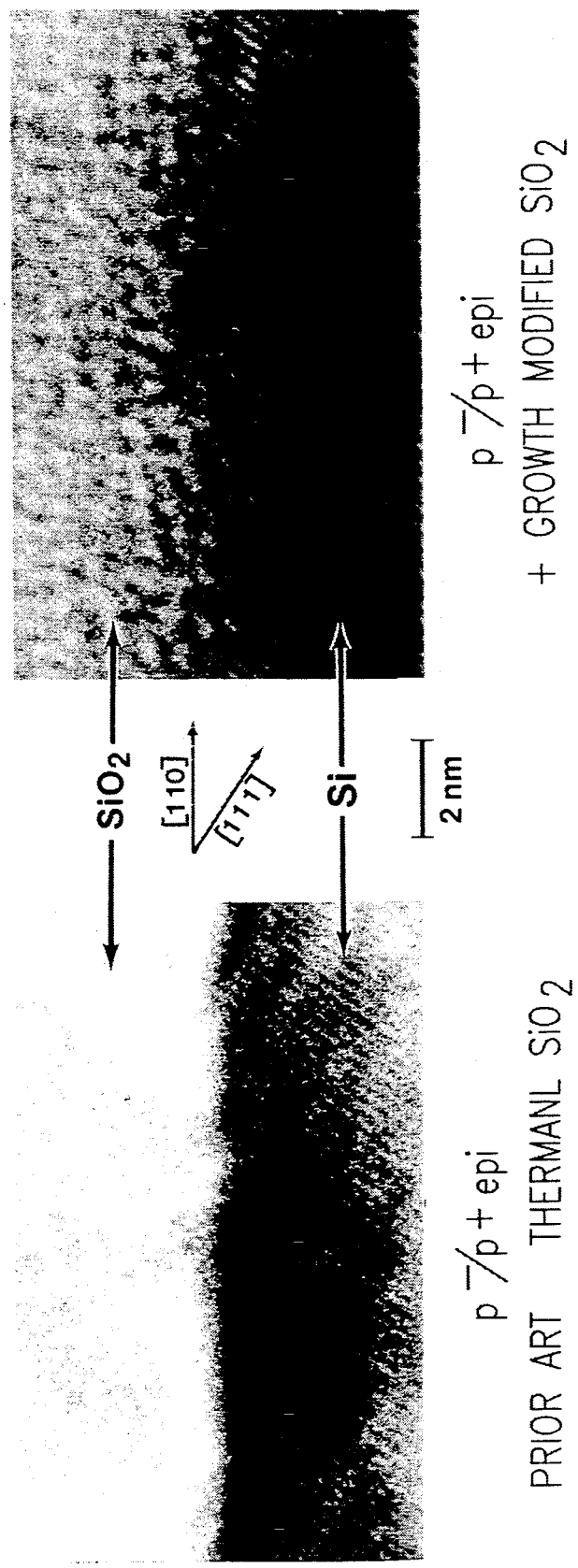
FIG. 3 contains the Si (111) lattice images for both a prior art thermal thin oxide and a growth-modified thin oxide of the invention.

FIG. 3 contains lattice images obtained with transmission electron microscopy (TEM) of both a structure with a prior art thermal oxide (left-hand image) and a structure with a growth-modified oxide formed in accordance with the present invention (right-hand image). The relatively large contrast modulation (as indicated by the darker areas) in the lattice image of the silicon layer near the interface in the prior art thermal oxide is attributed to localized strain fields. Such strain fields in the silicon layer are substantially reduced in the structure formed with the growth-modified process of the present invention when a preoxidation stress relief anneal is employed prior to the initiation of the thermal oxide growth. This strain reduction is represented in the lattice image of the growth-modified oxide by the uniformity of the structure, especially noticeable at the substrate/oxide interface. Additionally, an in situ preoxidation getter for removing contaminants has been found to further reduce this contrast modulation.

As mentioned above, the improvements made by the preoxidation silicon surface treatments of the present invention are both independent and cumulative, meaning that they may be used either alone or in combination to provide improvement to the structure of the thin oxide. Of course, the optimum results occur when both a preoxidation contaminant getter and a preoxidation stress-relief anneal are used. It is to be noted, also, that the order in which these operations are performed is not critical. That is, a stress-relief anneal may be performed prior to a contaminant getter (indeed, a gettering operation may be performed at $T_f$ of 900° C.). However, since the annealing must be performed at an elevated temperature, the process as outlined in FIG. 1 is considered to be the most logical sequence for incorporating these preoxidation silicon surface treatments into a standard manufacturing process.

Additionally, there exist many other preoxidation silicon surface treatments which may be used in the practice of the present invention. Other such treatments include, but are not limited to, the following: (1) a preoxidation high temperature hydrogen bake, (2) a high vacuum, high temperature anneal, or (3) a preoxidation plasma etching and UV treatment in an oxidizing environment; the first two processes being utilized to reduce the silicon substrate stress by removing any incoherent native oxide from the silicon substrate surface, and the latter being utilized to generate a relatively homogeneous, contaminant-free silicon nucleating surface for the subsequent oxide growth.

It is to be noted that although the present descriptions of the growth-modified process of the present invention are related to a standard hot wall atmospheric furnace oxidation process, the oxidation may also be performed by a rapid thermal oxidation (RTO) process using lasers, electron beams, or incoherent halogen lamps as a heating source for very short, high temperature treatments to control this thermally-driven surface reaction. Further, it is to be understood that although the transport of the oxidant through the growing oxide layer is normally driven by thermal energy, the oxidation may be performed at a relatively low temperature in an environment enhanced by a photon flux or an electric field, where these conditions are known to provide transport of the oxidizing species to the substrate interface and allow oxidation to take place.

EXPERIMENTAL RESULTS

Figure 4:
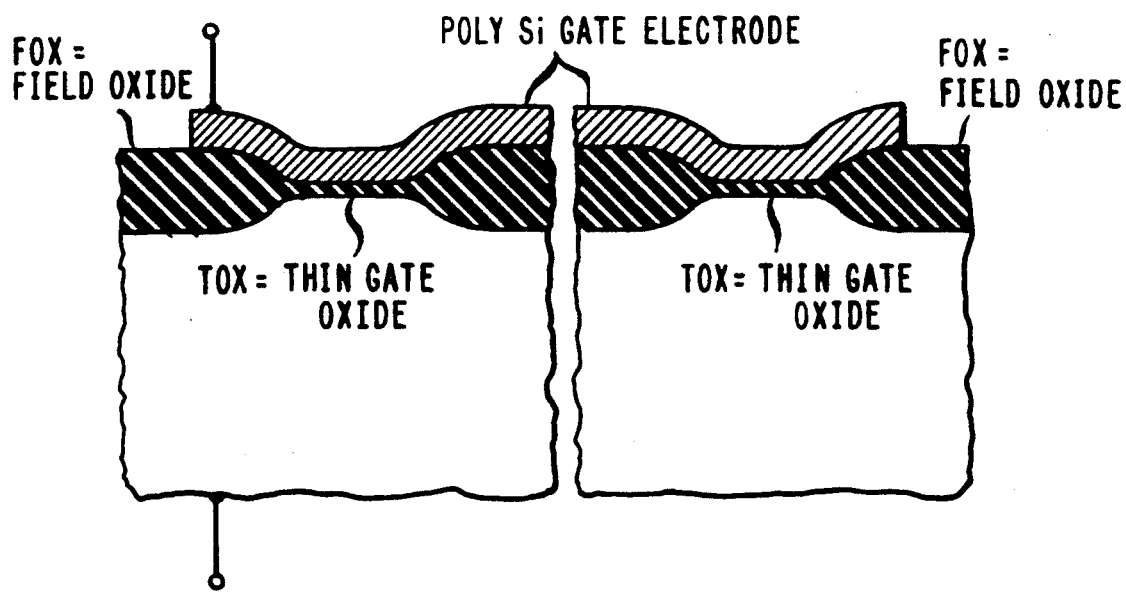
FIG. 4 illustrates an exemplary device test structure which may be used to measure the defect density $D_o$ in a growth-modified thin oxide film formed in accordance with the present invention.
Figure 5:
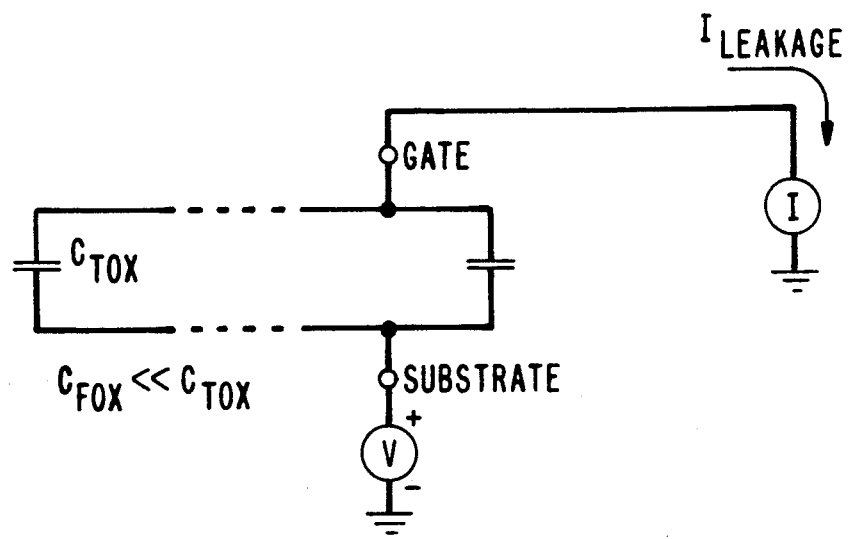
FIG. 5 illustrates the equivalent circuit representation of the structure shown in FIG. 4.
Figure 6:
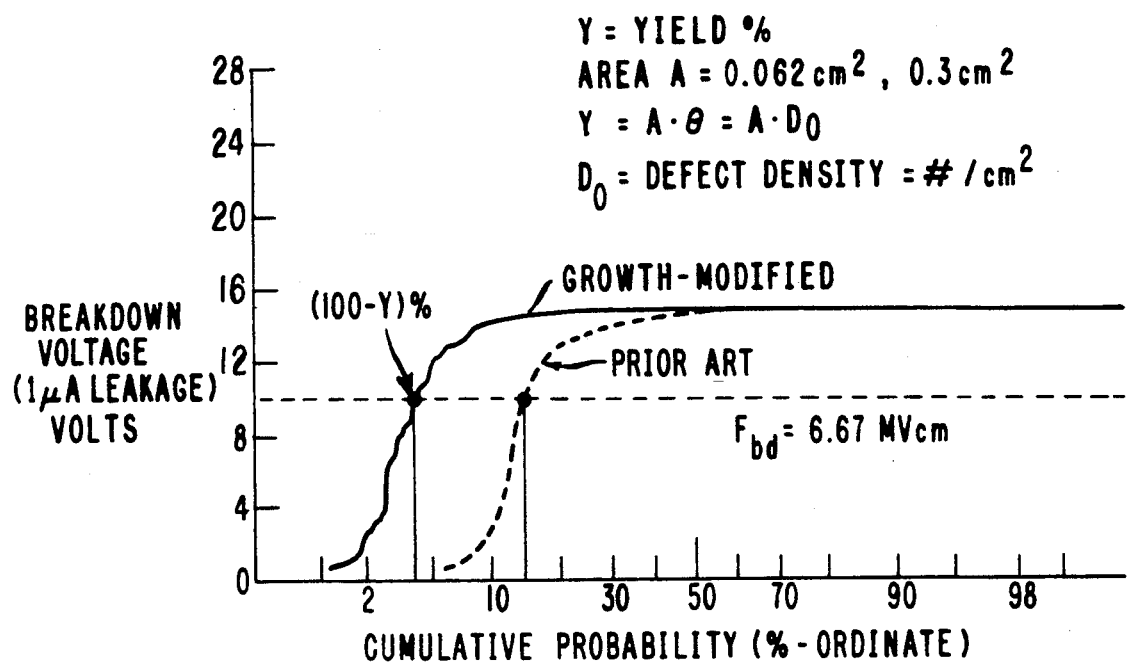
FIG. 6 contains comparative distribution plots illustrative of the defect densities for both a prior art oxide and a growth-modified oxide.

An exemplary method which was used to measure the defect density $D_o$ of a growth-modified thin oxide formed in accordance with the present invention required the utilization of an actual device structure (for example, a 1 Mbit DRAM), processed through the steps of local oxidation, polysilicon deposition and doping so as to form a capacitor structure. The device was then patterned to form a single field plate over the entire chip, as illustrated in FIG. 4. Tests were performed by applying a negative voltage ramp to the field plate (−1 V/sec at the applied bias, for example) until a leakage current level of 1 μA was reached. A schematic diagram of the test structure is illustrated in FIG. 5. The negative polarity with respect to the p-type substrate forced the capacitor structure into accumulation, thus minimizing surface depletion and voltage loss in the silicon region. A similar technique is described in detail in an article entitled "Materials Issues in Silicon IC Processing", by T. N. Nguyen et al., appearing in the *MRS Symposia Proceedings*, V-71, pp. 505-12, 1986. To assure high levels of confidence, tests were typically performed on 2000 capacitors for each run. Such a large number of measurements were essential for determining and detecting very small changes in $D_o$ for various gate oxides. The measured data were plotted as the cumulative probability distribution of the measured breakdown voltage at the 1 μA leakage current. The data for both a prior art thermal oxide and a growth-modified oxide of the present invention are illustrated in FIG. 6. The yield (Y) of the group of capacitor sites being tested is then defined as the percentage of sites which exhibited a leakage current less than 1 μA which withstood a given breakdown voltage ($F_{bd}=6.67$ MV cm$^{-1}$, for example). The defect density $D_o$ can then be calculated from the yield data from the following relation:

$$Y = \exp(-AD_o),$$

where A is defined as the area being tested. As seen by reference to FIG. 6, the yield Y increased from approximately 82% for the prior art thermal oxide to approximately 96% for the growth-modified oxide of the present invention. Using the above relation, the defect density $D_o$ decreased from a value of $0.7000^{-2}$ for the prior art thermal oxide to a level of approximately 0.2 cm$^{-2}$ for the growth-modified oxide. The improvement in both yield and $D_o$ for the growth-modified oxide films are apparent.

Figure 7:
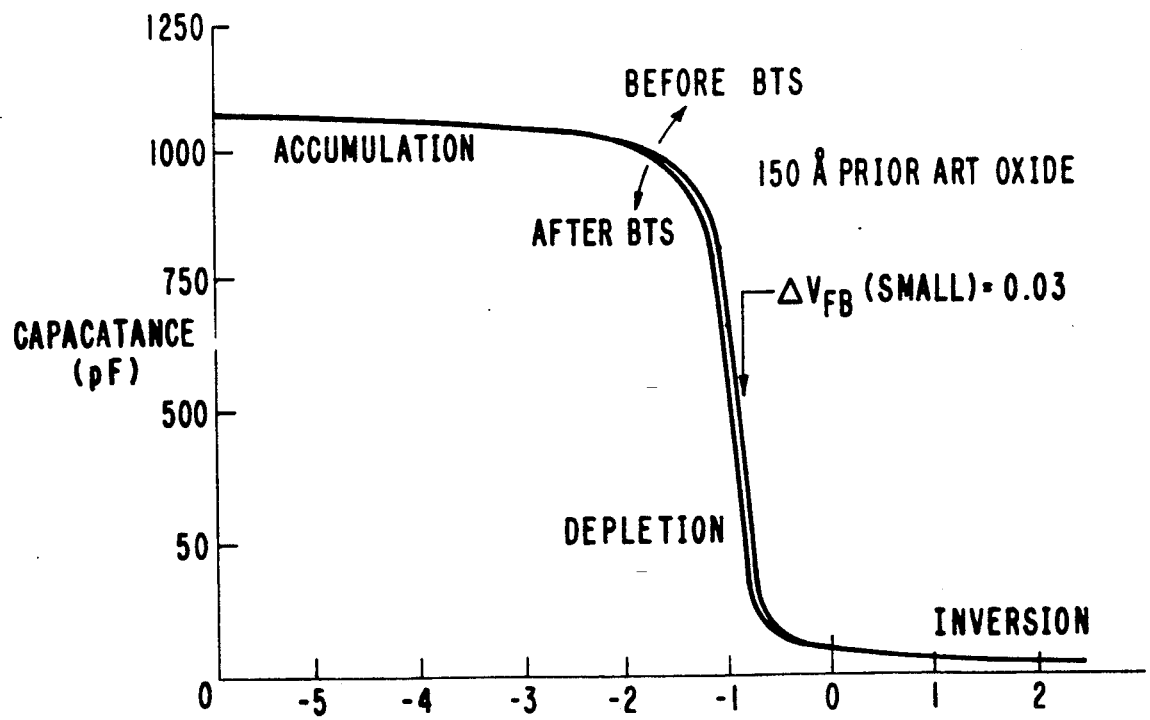
FIG. 7 contains C-V curves illustrating the effect of bias-temperature-stressing (BTS) on a prior art thermal oxide.
Figure 8:
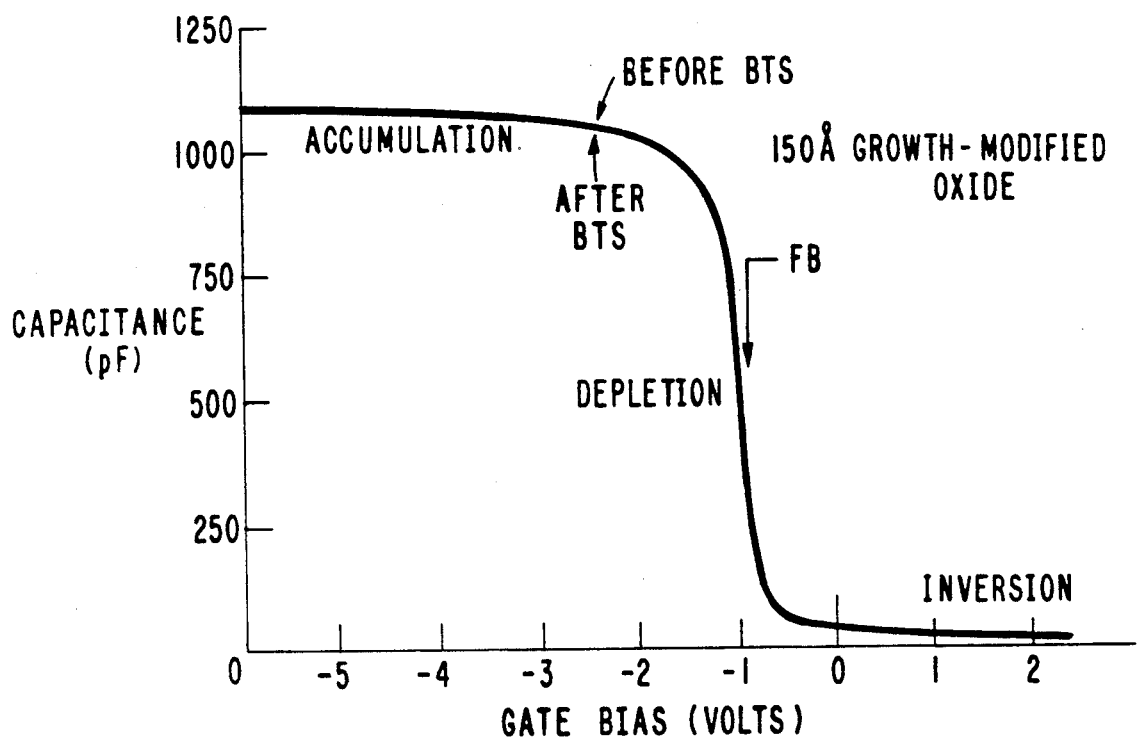
FIG. 8 contains C-V curves illustrating the effect of bias-temperature-stressing (BTS) on a growth-modified oxide of the present invention.

The capacitance-voltage (C-V) stability of the growth-modified oxide was evaluated by bias-temperature-stressing (BTS) of the oxide at 250° C. under a 2 MV/cm field for 10 minutes and monitoring the flat band voltage shift ($\Delta V_{FB}$) in the high frequency C-V curves. Any flat-band shift to a more negative value after stressing indicates a build-up of positive charge at the Si/SiO$_2$ interface, which is usually due to mobile ion contamination in the oxide and/or hole injection from the substrate. Similarly, a more positive $\Delta V_{FB}$ after stressing is probably due to hot electron injection from the substrate. FIG. 7 illustrates the BTS effects on the C-V characteristics for MOS capacitors including a prior art thermal oxide film. The C-V characteristics for MOS capacitors including a growth-modified oxide film are illustrated in FIG. 8. The growth-modified oxide films showed virtually no instabilities subsequent to the bias-temperature-stressing, while the prior art oxide films showed only a slight flat band voltage shift ($\Delta V_{FB} = -0.03$ V), as illustrated in FIG. 6(a). These results indicate lower trapped charge ($Q_{it}$), flat band shift ($\Delta V_{FB}$) and mobile ion concentration ($N_{mi}$) in growth-modified films when compared to prior art thermal oxide films of an equivalent thickness.

Figure 9:
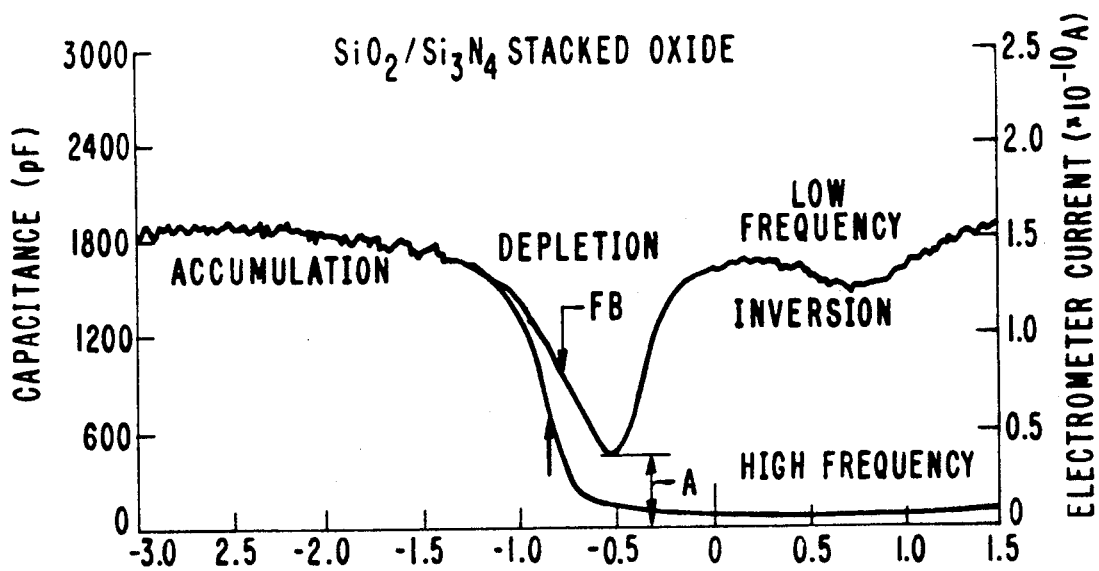
FIGS. 9-11 contain combined high and low frequency C-V plots for a prior art SiO$_2$/Si$_3$N$_4$ stacked oxide (FIG. 9), a prior art thermal oxide (FIG. 10), and a growth-modified oxide of the present invention (FIG. 11).
Figure 10:
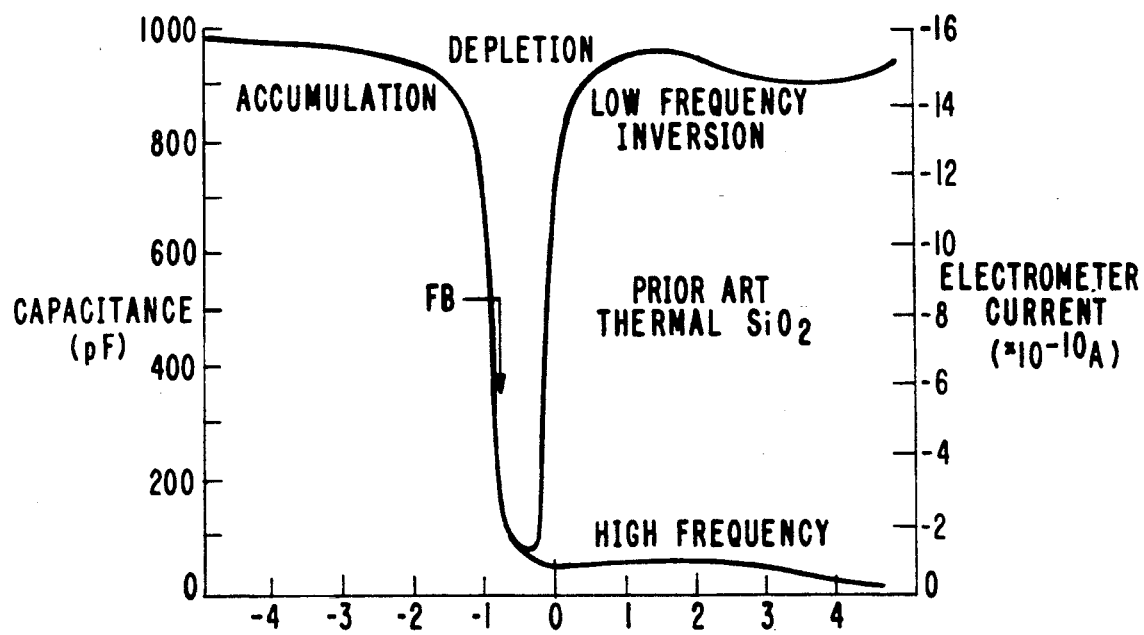
Figure 11:
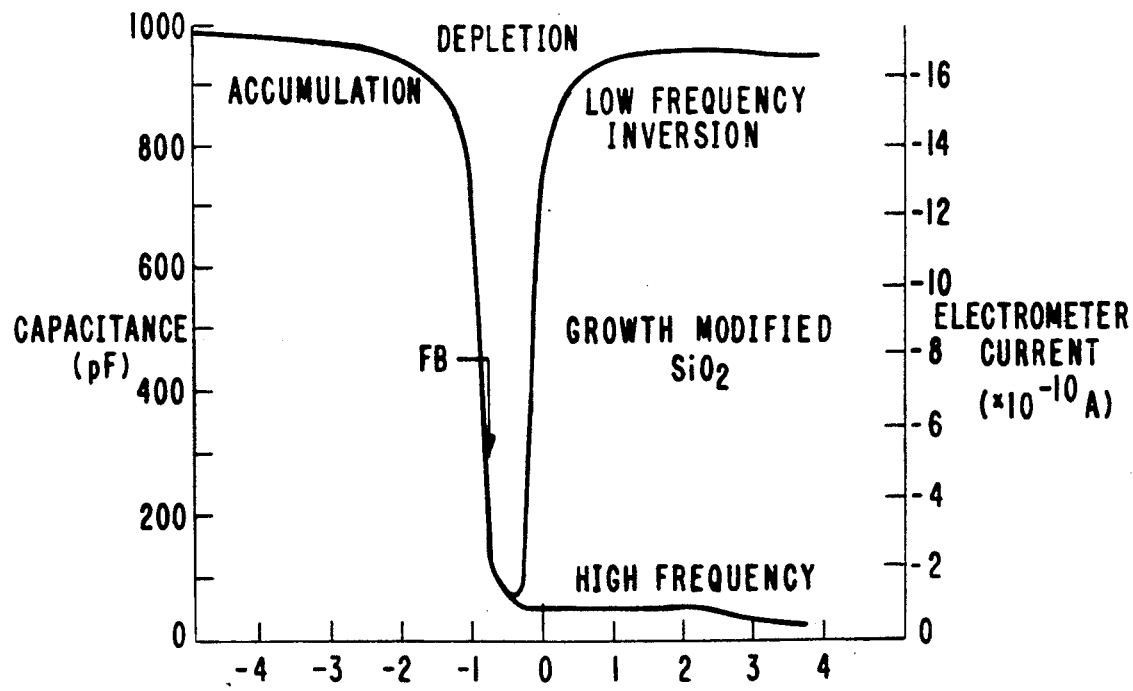

FIGS. 9-11 illustrate the combined high and low frequency C-V plots for three different oxides: (a) a stacked oxide comprising a prior art SiO$_2$/Si$_3$N$_4$ structure (FIG. 9); (b) a prior art thermal oxide structure (FIG. 10); and (c) a growth-modified oxide of the present invention (FIG. 11). The large difference in capacitance, denoted by the letter "A", at the onset of inversion for the stacked oxide plots of FIG. 9 is attributed to the high density of interface traps $Q_{it}$ at the interface between the SiO$_2$ and Si$_3$N$_4$ layers. These traps also account for the modulation present in the inversion region of the low frequency plot. In comparison, the prior art thermal and growth-modified oxides exhibit virtually difference in capacitance. The growth-modified oxide, as seen by reference to FIG. 11 illustrated a slight improvement in the low frequency inversion region, in terms of linearity of capacitance, when compared to the prior art thermal oxide plot of FIG. 10.

TABLE 1

| Growth Process $T_i = 700°$ C.; $T_f = 950°$ C. | $D_o$ #/cm$^2$ | $Q_T$ × 10$^{10}$/cm$^2$ | $N_{mi}$ × 10$^{10}$/cm$^2$ | Si(400) Peak Profile* Position, 2θ° | Width, β° | Stress in Si × 10$^9$ dynes/cm$^2$ |
|---|---|---|---|---|---|---|
| (1) Prior Art Thermal Oxide | 0.35 | 5.0 | 1.5 | 69.1400 | 0.7300 | 1.58 |
| (2) Growth-Modified Getter & Anneal | 0.15 | 2.5 | <0.2 | 69.1820 | 0.7180 | 0.40 |
| (3) Growth-Modified Getter | 0.22 | | | 69.1500 | 0.7200 | 1.120 |
| (4) Growth-Modified Anneal | 0.28 | | | 69.1700 | 0.7360 | 0.80 |
| | | | | *(100)Si Unstressed 69.1975 | 0.7000 | 0.00 |

$Q_T$ = total trapped charge = interface trapped charge $Q_{it}$ and fixed charge $Q_f$.

I claim:
1. A method of fabricating a semiconductor structure including a relatively thin thermal oxide layer grown on a silicon surface, the method including the steps of:
   a) providing a silicon surface at a first ambient temperature in the range of 600°–750° C.;
   b) increasing the ambient temperature to a second value required for oxidation in the range of 900°–950° C.;
   c) initiating and maintaining oxide growth by subjecting the silicon surface to an oxygen ambient for a period of time related to the desired thickness of the grown oxide; and
   d) removing the oxygen ambient to terminate the oxide growth characterized in that the process includes performing an in situ preoxidation silicon surface treatment before initiating the oxide growth of step c), the steps including 1) gettering the silicon surface in a chlorine-containing ambient, at the first ambient temperature, to remove contaminants at said silicon surface; and
2) annealing, at the second temperature, the silicon surface gettered in step 1), the annealing to minimize local stress variations in said silicon surface.

2. The method of claim 1 wherein preparation step 1) is performed prior to step b) and preparation step 2) is performed after step b).

3. The method of claim 1 wherein in performing preparation step 1), the chlorine-containing ambient is chosen from the group consisting of hydrochloric acid, trichloroethane and trichloroethene.

4. The method of claim 1 wherein in performing preparation step 2), an argon ambient is used.

* * * * *